United States Patent [19]

Jordan et al.

[11] E Re. 29,812

[45] Reissued Oct. 24, 1978

[54] PHOTOVOLTAIC CELL

[75] Inventors: John F. Jordan; Curtis M. Lampkin, both of El Paso, Tex.

[73] Assignee: Photon Power, Inc., El Paso, Tex.

[21] Appl. No.: 787,533

[22] Filed: Apr. 14, 1977

Related U.S. Patent Documents

Reissue of:

[64] Patent No.: 3,902,920
Issued: Sep. 2, 1975
Appl. No.: 303,365
Filed: Nov. 3, 1972

[51] Int. Cl.[2] ..... H01L 31/06

[52] U.S. Cl. ..... 136/89 TF; 136/89 CD; 136/89 CC; 29/572; 427/74; 427/110; 357/16; 357/30; 357/59

[58] Field of Search ..... 136/89 CD, 89 CC, 89 TF; 357/16, 30, 59

[56] References Cited

U.S. PATENT DOCUMENTS

| | | | |
|---|---|---|---|
| 2,820,841 | 1/1958 | Carlson et al. | 136/89 |
| 2,844,640 | 7/1958 | Reynolds | 136/89 |
| 2,981,777 | 4/1961 | Reynolds | 136/89 |
| 2,999,240 | 9/1961 | Nicoll | 136/89 |
| 3,049,622 | 8/1962 | Ahlstrom et al. | 317/235 X |
| 3,146,138 | 8/1964 | Shirland | 148/187 |
| 3,148,084 | 9/1964 | Hill et al. | 136/89 X |
| 3,186,874 | 6/1965 | Gorski | 136/89 |
| 3,290,175 | 12/1966 | Cusano et al. | 136/89 |
| 3,351,502 | 11/1967 | Rediker | 317/235 X |
| 3,368,125 | 2/1968 | Pasierh | 317/235 X |
| 3,376,163 | 5/1968 | Abrahamsohn | 136/89 |
| 3,411,050 | 11/1968 | Middleton et al. | 136/89 X |
| 3,586,541 | 6/1971 | Chamberlin | 136/206 |
| 3,888,697 | 6/1975 | Bogus et al. | 136/89 |
| 4,042,418 | 8/1977 | Biter | 136/89 P |

*Primary Examiner*—Aaron Weisstuch
*Attorney, Agent, or Firm*—Bard & Groves

[57] ABSTRACT

A large area photovoltaic cell comprising a layer of multicrystalline cadmium sulfide, about 1 to 2 microns thick, formed by simultaneously spraying two suitably selected compounds on a uniformly heated plate of Nesa glass, thereafter forming a coating of $Cu_2S$ by spraying two suitable compounds over the cadmium sulfide layer while the latter is heated, to form a photovoltaic heterojunction, applying thereover a layer of CuSO4, and applying electrodes of Cu and Zn, respectively, to separated areas of the layer of $CuSO_4$, and heating the cell to form a cuprous oxide rectifying junction under the copper electrode by reaction of the Cu electrode with the $CuSO_4$, while diffusing the zinc through the body of the cell. The diffusion of the zinc provides a negative electrode coplanar with the positive copper electrode, eliminating any need for introducing mechanically complex provision for making a connection to the Nesa glass, while the use of a rectifying positive electrode enables use of a layer of CdS only 1 to 2 microns thick, rather than the usual 20 microns, despite the fact that such thin layers tend to have pinholes, which in the prior art render the cells inoperative but in the present teaching do not.

12 Claims, 4 Drawing Figures

PHOTOVOLTAIC CELL

Matter enclosed in heavy brackets [ ] appears in the original patent but forms no part of this reissue specification; matter printed in italics indicates the additions made by reissue.

BACKGROUND

In the art of making micro-crystal cadmium sulfide volatic cells it has been the practice to fabricate the cadmium sulfide layer of considerable thickness, say 20 microns. This has been deemed necessary to assure that pin holes, or other types of defects do not occur in the layer which if present render the cell inoperative. It has heretofore been considered unfeasible to utilize extremely thin layers of cadmium sulfide because a large proportion of the cells prove defective in practice. It is one purpose of the present invention to provide a large area photovoltaic cell capable of being incorporated in a system employing areas of photovoltaic generators covering areas of the order of square miles, to enable large scale production of electric power. In such systems the total quantity of cadmium required becomes a problem since cadmium is in short supply in the United States and is expensive Reduction of the feasible thickness of cadmium compound required to fabricate a given area of cell is therefore crucial economically and a reduction of thickness of CdS layer by an order of magnitude or more renders ecconomically feasible a large scale power generator of the photovoltaic type which otherwise is not economically feasible. Utilization of minimum cadmium per unit area of cell is rendered feasible by utilization of a rectifying positive electrode in the cell.

It is, accordingly, a primary object of the present invention to provide a photovoltaic cell which utilizes minimum weight of cadmium per unit area and which can therefore be economically utilized as a power source in a large scale electrical power generation system. This same objective is subserved by providing a call which has only coplanar electrodes, and also in terms of time required to fabricate a given area of cell, a twenty micron layer requiring twenty times as much spray time as does a one micron layer in forming the requisite cadmium sulphide microcrystalline layer on a substrate.

In the U.S. Pat No. 3,148,084, to Hill et al. issued Sept. 8, 1964, a method is taught for forming a layer of cadmium sulphide microcrystals on a glass substrate. Essentially, the method involves spraying the glass substrate while the layer is hot, with a cadmium salt-thiourea complex, i.e., cadmium chloride plus a thiourea, in suitable proportions. The teaching of the patent is that the glass may be heated by means of a hot plate and that the spraying may take place in the atmosphere. We have found that precisely uniform temperature of the glass plate is essential and that a hot plate is not able to heat a glass plate uniformly because the hot plate and the glass plate do not make perfect contact throughout and that even slight non-uniformities of temperature of the glass substrate produce anomalous areas of the layer of CdS which can render an entire photovoltaic cell inoperative. The layer of CdS must grow in the form of many tiny crystals the anes of which are predominantly parallel. Application of the sprayed materials at a uniform and sufficiently slow rate is important as is uniformity of temperature to assure uniformity of crystal growth rate and of orientation over the entire glass plate. We have found that application of very intense ultraviolet light over the entire CdS microcrystalline layer, as it grows, to enhance uniformity and orientation of crystal growth improves the end product, as evidenced by the fact that the percentage of plates which prove imperfect is reduced. The layer of CdS may be only about 1.0 to 2.0 microns thick, in the process of the present invention, which is contrary to prior art practice.

In order to provide uniformity of temperature over the entire glass plate, according to one feature of the invention, the plate is floated during coating in melted tin, at over 700° F.

In accordance with the teaching of U.S. patent to A. E. Carlson, U.S. Pat. No. 2,820,841, issued Jan. 21, 1958, it is necessary to superimpose $Cu_2S$ to form a heterojunction on a layer of CdS micro-crystals formed on Nesa glass. This is accomplished according to the present invention by spraying on the layer of CdS while the latter is at about 200° F. to 300° F., a small quantity of copper acetate and of N,N-dimethyl thiourea, which, in impinging against the hot CdS, forms a layer of $Cu_2S$ about 1000. A thick thereover. Since the layer of $Cu_2S$ is formed by spraying cold materials which form $Cu_2S$ only on contact with the Cds layer, a flat layer is formed which so combines with the exposed parts of the CdS crystals as to form the required photovoltaic junction.

At this point, according to the teaching of Carlson, supra, it would appear only necessary to apply an electrode to the $Cu_2S$ layer and a lead to the Nesa glass, to complete the fabrication of a photovoltaic cell. A cell so fabricated is not satisfactory. Nesa glass is conductive only because it has a coating of tin oxide. But, tin oxide has high resistance taken along the surface of the glass, so that a great deal of the energy generated by the cell is lost in the tin oxide layer, and this is the more true the larger is the cell. The problem can be ameliorated by breaking up larger cells into smaller cells, as in FIG. 4 of Carlson et al., but only at the cost of added complexity of fabrication.

According to the present invention, we deposit over the layer of $Cu_2S$ a layer of $CuSO_4$, by spraying, and over the latter deposit two separated electrodes of copper and zinc, respectively. On heating the cell to about 500° F. for about 12 minutes, the $CuSO_4$ gives up oxygen to the copper electrode, forming a $Cu_2O$ rectifying junction which is conductive for current flow out of the copper electrode, but the zinc diffuses down through the layers which it overlies, sometimes down to the layer of tin oxide and sometimes only to but not through the CdS layer. In any event, it has been found that if the tin oxide layer be considered to be at ground potential, the copper electrode may be at 420. mv., while the zinc electrode may be, in some samples at 0. mv., and in others at minus 20. mv. The copper and zinc electrodes may be interdigitated and the interdigitations located sufficiently close together that the return paths for current internally of the cell along the tin oxide layer can be short, yet the electrode and lead system can remain simple, and easy to fabricate, requiring no etching through the CdS - $Cu_2S$ sandwich.

The rectifying Cu-$Cu_2O$ junction serves to prevent flow of reverse currents through holes which sometimes times develop in the CdS layer. Such holes may occur due to defects of the fabricating process and when they occur the cell is defective because a short circuit path to the SnOx is then available and it is the presence of the junction which renders feasible the reduction of cadmium usage by an order of magnitude, in comparison with prior art cells.

SUMMARY

A photovoltaic cell, including a layer of tin oxide on a glass base, a layer of uniformly oriented cadmium sulfide microcrystals on the film of tin oxide a layer of $Cu_2S$ the cadmium sulfide so applied as to form a heterojunction, a layer of $CuSO_4$ on the $Cu_2S$ layer and mutually isolated electrodes of Cu and Zn on the $CuSO_4$ heated to form a Cu-$Cu_2O$ rectifying junction, while the Zn diffuses down through the layers underlying and thereby renders them conductive. The CdS may be or may not be impregnated with zinc, providing either a half cell underlying the zinc which is of zero voltage with respect to the tin oxide, or of −20. mv. The Cu-$CuSO_4$ junction provides oxygen for the rectifying junction, which reduces or largely prevents a shorting of the $Cu_2S$-CdS layer when the $Cu_2S$ layer or the CdS layer is defective due to the presence of holes in the layers. The CdS and the $Cu_2S$ layers are deposited by successively spraying respectively a cadmium salt-thiourea solution and a copper salt N,N-dimethyl thiourea solution while the glass is floating in molten metal baths of suitable temperatures allowing CdS microcrystals and a heterojunction with $Cu_2S$ to develop only on contact of each complex with a suitable heated surface.

DETAILED DESCRIPTION

Figure 1:
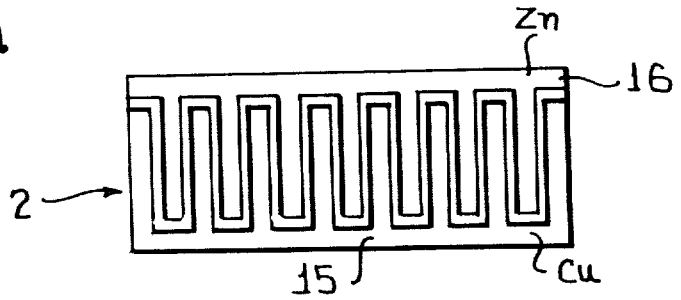
FIG. 1 is a view in plan of a photovoltaic cell according to the invention, showing interdigitated coplanar electrodes.
Figure 2:
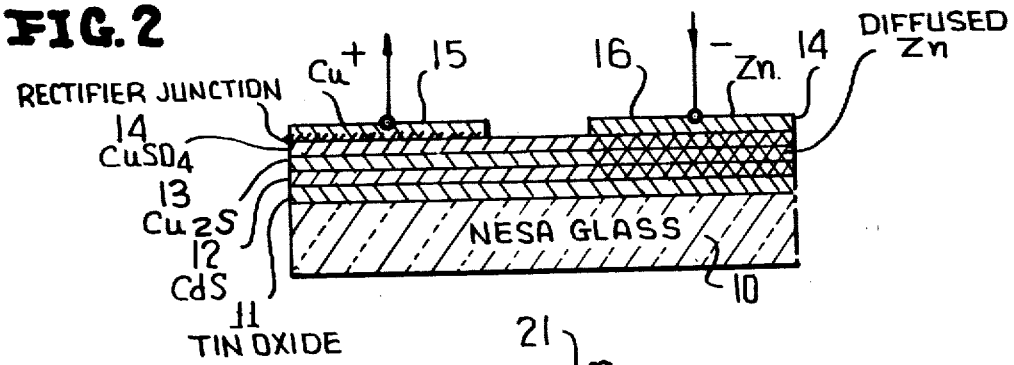
FIG. 2 is a view in section taken on line 2—2 of FIG. 1.

In FIG. 1, 10 is a plate of Nesa glass, i.e., non-conductive glass having on one of its surfaces a thin layer 11 of tin oxide, which is conductive. Overlying the layer 11 of tin oxide is a layer 12 of polycrystalline CdS formed by a novel process according to the present invention. Overlying the layer 12 of CdS is a further layer 13 of $Cu_2S$, also formed by a novel process according to the present invention. Overlying the CdS layer is a thin layer 14 of $CuSO_4$, on which are deposited positive and negative electrodes 15, 16, of Cu and Zn respectively.

The CdS and $Cu_2S$ layers, at their interface, form a voltage generating heterojunction, the $Cu_2S$ being positive and CdS being negative, when the CdS is illuminated by light of the proper wavelength. Specifically, the cell is responsive to sunlight.

The voltage generated at the heterojunction between the micro-crystalline CdS and the $Cu_2S$ is communicated via the $CuSO_4$ layer to the Cu electrode 15. A reaction occurs between the $CuSO_4$ and the Cu electrode when the latter is heated to 500° F. for about 12 minutes. forming a rectifying junction R of Cu - $Cu_2O$, which is conductive of current out of the cell, so that there is no interference with operation of the cell. The function of the rectifying junction R will be described hereinafter.

In the prior art it was usual to utilize a tin oxide layer on glass as the ground electrode of a CdS - $Cu_2S$ solar cell. But resistance is high parallel to the surface of the glass through the thin layer of tin oxide, and therefore the efficiency of the cell is low. To reduce losses in the cell, the cell is, according to the prior art, slotted to provide access to the tin oxide at multiple areas thereof, see Carlson. According to the present invention, a zinc electrode 16 is deposited over the $CuSO_4$, but separated from the Cu electrode, supra. When heated, the zinc diffuses down into the underlying layers, down to the tin oxide in some cases, and down to the CdS in other cases. The cell is heated to about 500° F. for about 12 minutes, and it is at this time that the Cu - $Cu_2O$ junction is also formed. The Zn diffuses to the tin oxide and to diffuse the zinc a highly conducting path is provided from the tin oxide to the zinc electrode 15, which now becomes the ground of negative electrode of the cell. It is found, in many cells, that the Zn electrode is about 20. mv. below the voltage level of the tin oxide layer 11. This seems to imply that the CdS is active and in conjunction with the Zn forms a negative cell. By interdigitating the Cu and Zn electrodes, 15 and 16, as in FIG. 1, a cell of considerably higher efficiency than that taught by Carlson et al. is provided, and yet the fabrication is much less costly since the electrodes are co-planar and no etching or machining is required. Efficiency is high because paths through the tin oxide are kept short, a concept broadly suggested in FIG. 4 of Carlson et al. But, according to the present invention, discrete paths to the SnOx are formed solely by doping, and the doping is provided by the negative electrode material utilized, whereas in Carlson machining or etching is required. The normal voltage of the Cu electrode 15, with respect to the tin oxide layer 11, is about 420. mv. Use of Zn does not degrade this voltage, in any case, and in most cases adds 20. mv. to the available output.

Figure 3:
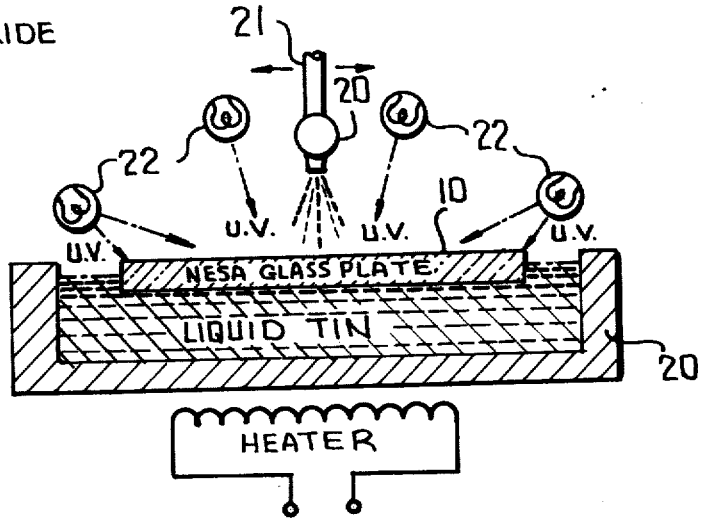
FIG. 3 is a view in section showing the mode of processing a glass plate to form a CdS micro-crystalline layer according to the invention.

The Hill et al patent, supra, teaches that the glass plate which forms a substrate in the present ystem must be hot, about 700° F., while being sprayed, and that the spraying must be sufficiently slow to permit uniform growth rates for the CdS micro-crystals of the layer. It has been found that any non-uniformities of temperature of the glass plate, producing temperature gradients along the surface of the plate, result in imperfect crystal growth, and therefore a defective cell. To avoid this contingency, the glass plate 10 is sprayed, according to FIG. 3, while the plate 10 is floating in a bath of molten metal, specifically tin. The glass plate 10 is not wet by the tin, so that when the glass plate 10 is removed from the molten tin bath, after it is sprayed, the underside of the plate is clean, or easily cleaned. The spray is provided via an [osciallating] *oscillating* nozzle 21, which repeatedly re-traces a planar path designed uniformly to cover the plate 10 with spray. The spray is a true water solution of cadmium chloride and thiourea. As the fine droplets of the spray contact the hot surface of the glass plate 10, the water is heated to vaporization and the dissolved material is deposited on the plate, forming CdS, plus volatile materials, and the CdS, if it has nucleating areas available, grows as small crystals. The nucleating areas are provided by the tin oxide, and if the spray is sufficiently uniform and sufficiently slow, and if the temperature of the glass surface is adequately high and uniform, crystal growth is uniform and all the crystals have nearly the same spatial inclinations, so that a uniform layer of nearly indentical micro-crystals exists. It has been found that irradiating the crystals, as they grow, with high intensity U.V. light, from sources 22, assists in the crystal growing process and produces a higher yield of near perfect layers than is otherwise the case.

Figure 4:
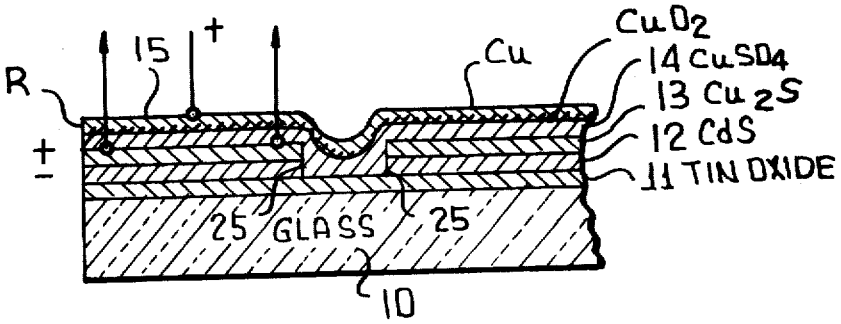
FIG. 4 is a view corresponding generally with FIG. 2, but in which it is assumed that a hole or defect exists in the CdS layer of FIG. 2.

It may happen that a layer of CdS micro-crystals is formed which contains one or more holes, as 25 in FIG. 4. In such case the $Cu_2S$ layer, which overlies the CdS. fills the hole, and the voltage generated at the junction between the CdS and the $Cu_2S$, when illuminated by radiation of appropriate wavelength may be shorted or find a low resistance path back to the tin oxide layer. More important, the Cu electrode 15, in its entirety, may be shorted to ground, i.e., to the SnOx layer, through this path, and therefore an entire cell is usually defective if one pin hole develops anywhere in the CdS layer.

According to the invention, however, a rectifying junction is formed at the underside of the positive copper electrode. This junction does not substantially inhibit flow of current out of the cell via the copper electrode, but it does inhibit flow of current back from the copper electrode to the layer of SnOx, so that presence of a hole in the CdS layer has no effect. The interposition of the layer of the $CuSO_4$ between the $Cu_2S$ and the Cu electrode, and subsequent heat treatment, raises the yield of operative cells in a production run.

The method of forming a CdS layer and a $Cu_2S$ layer is summarized as follows. A plate of Nesa glass is floated in a tin bath heated to 800° F., to provide 700° F. at the upper [surfact] *surface* of the glass plate. $CuCl_2 2\frac{1}{2}H_2O$ of 0.01 molar solution is employed, and an excess of thiourea, in de-ionized water, for the reaction desired. The desired thickness of the CdS polycrystal layer is about 1 or 2 microns.

The $Cu_2S$ 18 is developed by floating the glass plate previously coated with polycrystalline CdS, in a bath of molten metal at about 200° F. to 300° F., and spraying with a water solution of 0.0018 molar copper acetate and 0.001 molar of N,N-dimethyl thiourea, to a thickness of about 1000. A. The [$CuSo_4$] *$CuSO_4$* is sprayed over the $Cu_2S$ layer to a thickness of about 250. A. to 1000 A and the Cu and Zn are deposited as interdigitated electrodes. The entire cell is then heated to 500° F. for about 12 minutes causing Cu —$Cu_2O$ layer to form at the copper, and causing the Zn to diffuse.

The copper and zinc electrodes may be radiation heated via separate masks to provide optimum heating in each case for the chemical and/or physical effects desired.

While one specific embodiment has been provided involving a CdS - $Cu_2S$ heterojunction, the features of the invention relating to (1) uniformity of heating of the substrate; (2) irradiation by ultraviolet light while the microcrystals are being formed; (3) provision of a rectifying positive terminal formed by interaction with an oxygen-bearing layer underlying the positive terminal; (4) provision of a diffused co-planar negative terminal, are all utilizable with any form of micrycrystalline heterojunction, and are not limited to CdS - $CU_2S$, or to either of these.

What is claimed is:

1. A solar cell, comprising a transparent conductive base, a layer of CdS microcrystals about 1 micron to 2 microns in thickness coated on said base, a layer of $Cu_2S$ coated over said layer of CdS microcrystals and forming a photovoltaic heterojunction therewith, a copper electrode superposed over a portion of said layer of $Cu_2S$, a zinc electrode superposed over [a] *another* portion of said layer of $Cu_2S$, and a quantity of zinc diffused under said zinc electrode to provide a conductive path from said zinc electrode to said conductive base.

2. The combination according to claim 1, wherein *there* is provided a layer of copper sulphate between said electrodes and said layer of $Cu_2S$.

3. The combination according to claim 1, wherein *there* is provided a rectifying Cu-$Cu_2O$ junction under said copper electrode, said junction being conductive in the direction out of said copper electrode.

4. The combination according to claim 1, wherein said electrodes are coplanar and interdigitated.

5. In a precursor photovoltaic cell, a conductive base, superposed layers of microcrystals on said conductive base, said superposed layers of microcrystals constituting a photovoltaic heterojunction, and a rectifying junction output electrode overlying said superposed layers of microcrystals, said rectifying junction being non-conductive in a sense such as to prevent flow of reverse current from said electrode into said heterojunction, said superposed layers of microcrystals including a layer of cadmium sulphide microcrystals and a layer of cuprous sulphide, said layer of cadmium sulphide microcrystals *contacting said conductive base and* being about 1 to 2 microns thick, said rectifying junction is a copper - cuprous oxide layer, and a layer of [cuprous] *curpic* sulphate being interposed between said electrode and said heterojunction.

6. A precursor photovoltaic cell, comprising a transparent conductive substrate, a first layer of photovoltaically active microcrystals on said substrate, a layer of microcrystals coated over said first layer and forming with said first layer a photovoltaic heterojunction, an electrode coating said heterojunction, said electrode being a rectifying coating non-conductive in the sense from said electrode to said conductive substrate, said photovoltaic heterojunction being constituted essentially of cadmium sulphide microcrystals as one layer and of cuprous sulphide as the other layer, wherein said cadmium sulphide layer *contacts said substrate and* is about 1 or 2 microns thick, said rectifying coating being a cuprous oxide - copper rectifier, and a layer of [cuprous] *cupric* sulphate interposed between said rectifying coating and said heterojunction.

7. In a precursor photovoltaic cell, a microcrystalline photovoltaic heterojunction, a layer of [cuprous] *cupric* sulphate superposed over said heterojunction, a layer of copper superposed over said layer of [cuprous] *cupric* sulphate, and copper oxide formed at the junction of said layers of [cuprous] *cupric* sulphate and copper by interaction between said [cuprous] *curpic*-sulphate and said copper.

*8. A solar cell, comprising*

*a transparent conductive base,*

*a layer of CdS microcrystals coated on said base,*

*a layer of $Cu_2S$ coated over said layer of CdS microcrystals and forming a photovoltaic heterojunction therewith,*

*a metallic positive electrode superposed over a portion of said layer of $Cu_2S$,*

*a zinc negative electrode superposed over another portion of said layer of $Cu_2S$, and*

*a quantity of zinc diffused under said zinc electrode to provide a conductive path from said zinc electrode to said conductive base.*

*9. The solar cell described in claim 8, wherein said layer of CdS microcrystals is less than 20 microns in thickness.*

*10. The solar cell described in claim 9, wherein said positive electrode and said negative electrode are co-planar.*

*11. The solar cell described in claim 10, further including a rectifying junction layer interposed between said layer of* $Cu_2S$ and said positive electrode.

*12. The solar cell described in claim 11, wherein said rectifying junction layer includes* $Cu_2O$ *interposed between said* $Cu_2S$ *layer and said positive electrode.*

* * * * *